(12) United States Patent
Watanabe et al.

(10) Patent No.: US 6,262,902 B1
(45) Date of Patent: Jul. 17, 2001

(54) POWER CONVERSION COMPONENT WITH INTEGRAL OUTPUT CURRENT SHUNT AND ITS MANUFACTURING METHOD

(75) Inventors: Manabu Watanabe; Yoshinori Oda, both of Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 09/447,806

(22) Filed: Nov. 23, 1999

(30) Foreign Application Priority Data

Dec. 9, 1998 (JP) ................................................. 10-349597

(51) Int. Cl.$^7$ ...................................................... H02M 7/00
(52) U.S. Cl. .............................................................. 363/74
(58) Field of Search ................................. 363/74, 13, 34, 363/37, 50, 56, 78; 318/606, 635

(56) References Cited

U.S. PATENT DOCUMENTS 3,676,807 * 7/1972 Boer .
5,543,659 * 8/1996 Hosen .

OTHER PUBLICATIONS

Ferreira et al., "Integration of High Frequency Current Shunts in PowerElectronic Circuits", Jul. 1992, Power Electronics Specialists Conference, 1992. Record., 23rd Annual IEEE, pp. 1284–1290.*

Cronin & Kemp, "Current Shunts and Resistor in use in NAMAS accredited laboratories", Jul. 1992, Science, Measurement and Technology, IEEE Proceedings, p. 179–181.*

* cited by examiner

Primary Examiner—Charles Bowers
Assistant Examiner—Evan Pert
(74) Attorney, Agent, or Firm—Kanesaka & Takeuchi

(57) ABSTRACT

An intelligent power module (IPM) is formed of an inverter having power elements, a predriver for driving the inverter, and a protect circuit, and all these components are integrated into the same package. A shunt resistor is provided at an output of the inverter so that an end-to-end voltage of the shunt resistor can be output to an external device. This configuration enables an output current from an inverter apparatus incorporating the IPM to be detected without using a current transformer that requires a large installation space. In addition, the module terminals of the IPM and the terminal blocks of the inverter apparatus are integrated together to eliminate the need for wire rods and set screws for connections which are used to connect the module terminals and the terminal blocks together.

13 Claims, 10 Drawing Sheets

Fig. 9(A)
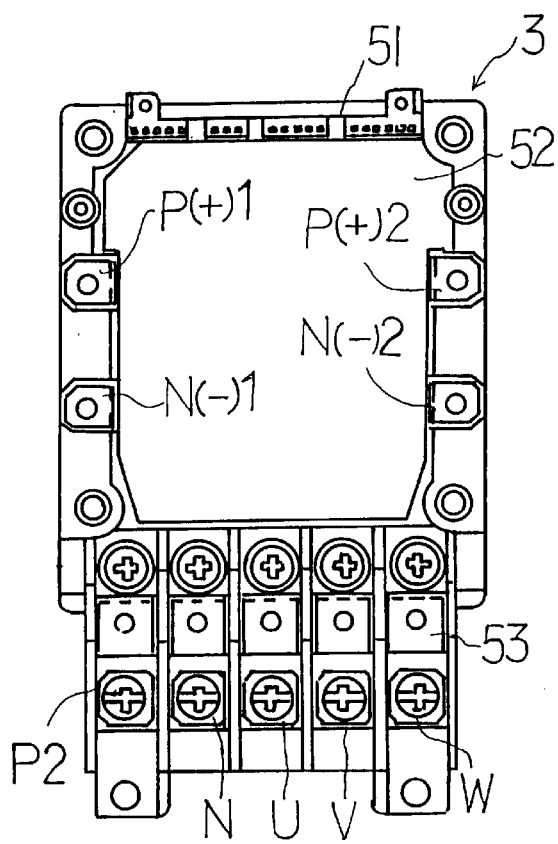
Fig. 9(B)
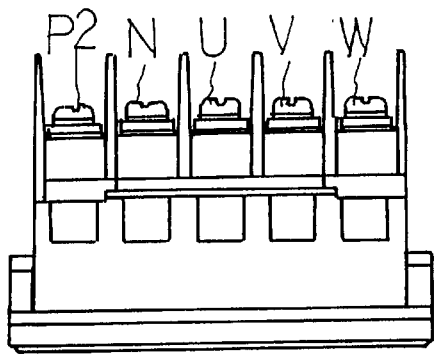
Fig. 9(C)
Fig. 9(D)
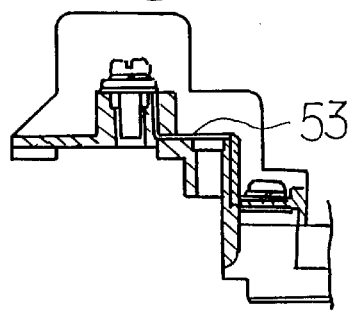
Fig. 9(E)
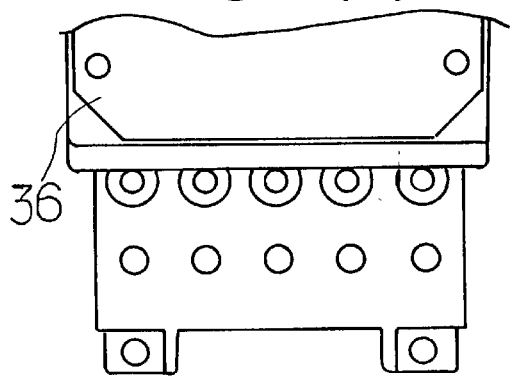
Fig. 9(F)
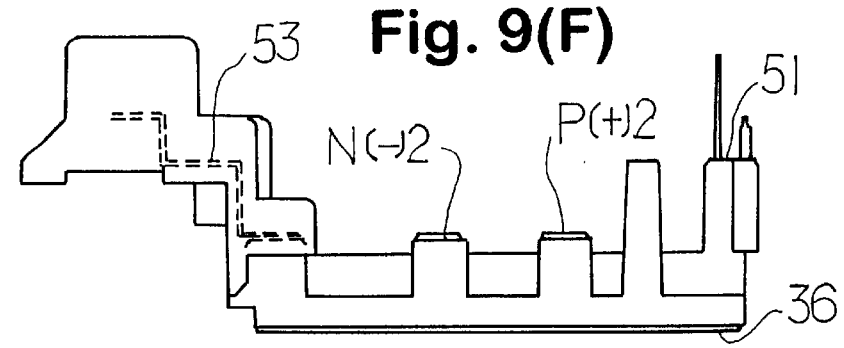

POWER CONVERSION COMPONENT WITH INTEGRAL OUTPUT CURRENT SHUNT AND ITS MANUFACTURING METHOD

BACKGROUND OF THE INVENTION AND RELATED ART STATEMENT

The present invention relates to a semiconductor device and in particular, to a power conversion component built in an electric conversion apparatus, such as general inverter apparatus, numerically controlled machine tool, or air conditioner.

In general, an inverter apparatus that is applied to a variable-speed device for a motor is composed of a power element for electric conversion, a drive circuit for controlling and driving the power element, a protection circuit, and a control circuit for generally controlling these components. A power conversion device having a semiconductor device called "intelligent power module" (hereafter referred to as "IPM") has been commercially available, and is formed of an integrated package including, in the above components, the power element for converting a direct current into an alternate current, the drive circuit, and the protection circuit.

FIG. 10 is a block diagram showing a configuration of a circuit in a conventional inverter apparatus. The inverter apparatus is composed of a converter 1 connected to a two- or three-phase alternate power supply to convert an alternate current into a direct current; an electrolytic capacitor 2 for smoothing; an IPM 3; a control circuit formed of a central processing unit 6 (CPU.ROM) including a buffer 4, a controller 5, and a memory; a power supply circuit for the IPM 3 and control circuit, formed of a switching transistor 7, transformers 8, 9, and a switching regulator 10; and a current transformer CT installed between an output of the IPM 3 and a motor M.

The IPM 3 is integrally composed of a three-phase inverter 11 composed of a power element and providing an output connected to the motor M; a predriver 12 for controlling and driving the inverter 11; a protect circuit 13; a sensor 14 for detecting an overcurrent; a sensor 15 for detecting overheating; a braking power element 16 and a resistor 17 that are used to provide deceleration control for the motor M; and a predriver 18 for controlling and driving the braking power element 16.

A control signal from the control circuit to the IPM 3 is supplied from the buffer 4 to the predrivers 12, 18 via a photocoupler, and an alarm signal issued when the sensor 14 or 15 detects an overcurrent or overheated condition is supplied from the protect circuit 13 to the buffer 4 via the photocoupler. In addition, an output from the current transformer CT is connected to the controller 5.

The current transformer CT detects an output current flowing from the IPM 3 to the motor M in order to return this current to the controller 5 for various controls. The current transformer CT has three through-holes therein, and is provided in the inverter apparatus in such a manner that wires or bars that act as output-current lines from the inverter 11 are inserted through these through-holes.

In the inverter apparatus with the configuration as described above, a direct voltage converted by the converter 1 is converted by the inverter 11 into an alternate voltage supplied to the motor M. In the inverter 11, bridges are assembled by using IGBTs (Insulated Gate Bipolar Transistors) and diodes, and the IGBTs chopping-control a direct current to allow an alternate current to consequently flow through the motor. By varying the frequency of this alternate current, the rotational speed of the motor can be varied.

In addition, an inverter output current detected by the current transformer CT is input to the controller 5, which controls such that the waveform of the output current will not be distorted or the output voltage does not exceed a predetermined value.

FIG. 11 is a block diagram showing a power conversion circuit in a conventional inverter apparatus. The power conversion circuit is composed of two modules, that is, the converter 1 and the IPM 3 including the inverter 11. Module terminals 21 to 25, which are shown by a circle, are provided for the converter 1 as I/O terminals, and module terminals 26 to 30 are provided for the IPM 3. In addition, terminal blocks R, S, T, P1, P2, N, U, V and W, which are shown by large black circles, are provided as I/O terminals for the converter 1 and inverter apparatus including the IPM 3.

The module terminals 21 to 30 of the converter 1 and IPM 3 are connected to the corresponding terminal blocks, and these connections are carried out by, for example, screwing copper bars to the blocks. The connections between the converter 1 and the inverter 11, that is, the connections between the terminal blocks P1 and P2 and between the module terminals 25 and 27 are also carried out by screwing copper bars to the blocks.

However, the current transformer built into the conventional inverter apparatus to monitor an output current is relatively larger than the other components and thus requires a large installation space, thereby hindering the development of more compact inverter apparatuses. In addition, since the wires or bars acting as output current lines must be inserted through the current transformer, the number of assembly steps is so large that the process becomes complicated.

In addition, since the module terminals and the terminal blocks are connected together by screwing the wire rods, such as copper bars, the apparatus requires a large number of set screws for connections, a complex wiring pattern, and a large number of assembly steps. In addition, an installation space must be provided for the wiring, and this constitutes a constraint on space-saving efforts.

The present invention has been made in view of these problems, and an object of the invention is to provide a power conversion component that can reduce a space for the incorporated devices and that can reduce requirements for both wiring space and the number of assembly steps.

Further objects and advantages will be apparent from the following description of the invention

SUMMARY OF THE INVENTION

In order to solve the above-noted problems, the present invention provides a power conversion component comprising a power semiconductor element, a drive circuit, and a protection circuit that are integrated into the same package, wherein the component further comprises a shunt resistor provided in series with output lines from the power semiconductor element to detect an output current; and control pins that can be drawn from both ends of the shunt resistor through a wiring pattern and connected to an external device.

According to such a power conversion component, the output current can be output to an external device through the control pins as the end-to-end voltage of the shunt resistor. This configuration enables the output current to be detected without a separate current transformer requiring a large installation space, thereby reducing a required space for the apparatus into which this power conversion component is integrated.

In addition, the present invention provides a power conversion component comprising a power semiconductor element, a drive circuit, and a protect circuit that are integrated into the same package, wherein at least some of module terminals connected to a main circuit of the power semiconductor element are configured as terminal blocks of an apparatus into which this power conversion component is integrated.

According to such a power conversion component, the module terminals of the power conversion component are integrated with the terminal blocks of the apparatus into which this power conversion component is integrated, thereby eliminating the need for the wire rods and set screws for connections used to connect the module terminals and terminal blocks. As a result, both the wiring space and the number of assembly steps can be reduced.

BRIEF DESCRIPTION OF THE DRAWINGS

FIGS. 4(A) and 4(B) are plan views of the shunt resistor, wherein FIG. 4(A) shows that bonding positions are evenly arranged and FIG. 4(B) shows relevant equipotential lines;

FIGS. 5(A) and 5(B) are plan views of the shunt resistor, wherein FIG. 5(A) shows that the bonding positions are biased to a side opposed to sense terminals, and FIG. 5(B) shows relevant equipotential lines;

FIGS. 6(A) and 6(B) are plan views of the shunt resistor, wherein FIG. 6(A) shows that the bonding positions are biased to the sense terminals, and FIG. 6(B) shows relevant equipotential lines;

FIGS. 8(A)–8(E) show an example of an appearance of IPM, wherein FIG. 8(A) is a plan view, FIG. 8(B) is a front view, FIG. 8(C) is a partial sectional view of a terminal block, FIG. 8(D) is a rear view, and FIG. 8(E) is a right side view;

FIGS. 9(A)–9(F) show another example of an appearance of the IPM, wherein FIG. 9(A) is a plan view, FIG. 9(B) is a front view, FIG. 9(C) is a rear view, FIG. 9(D) is a partial sectional view of a terminal block, FIG. 9(E) is a bottom view near the terminal block, and FIG. 9(F) is a right side view;

DETAILED DESCRIPTION OF PREFERRED EMBODIMENTS

Embodiments of the present invention are described below in detail with reference to the drawings, wherein the invention is applied to an IPM as an example.

Figure 1:
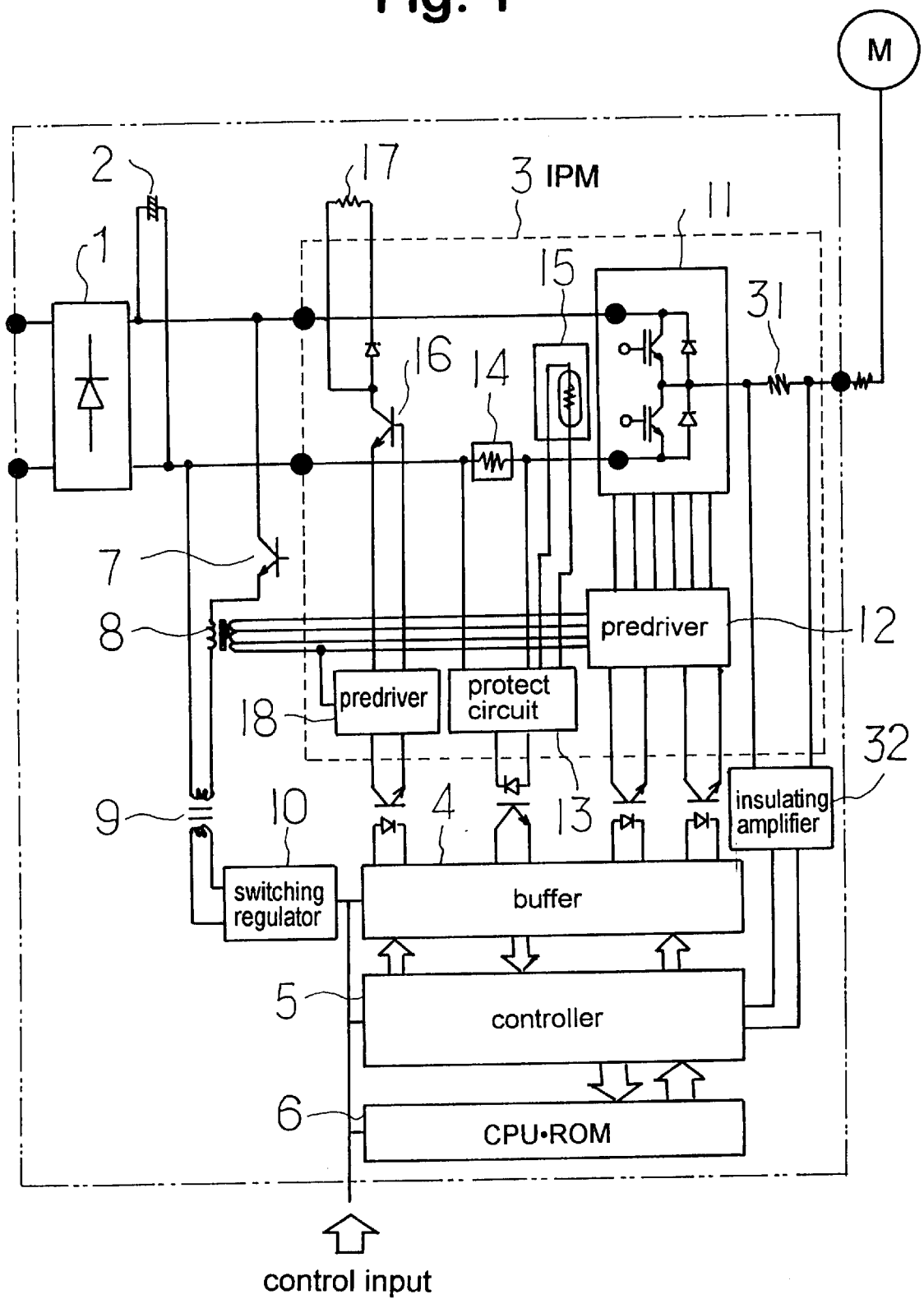
FIG. 1 is a block diagram showing a configuration of a circuit in an inverter apparatus including an IPM to which the present invention has been applied.
Figure 10:
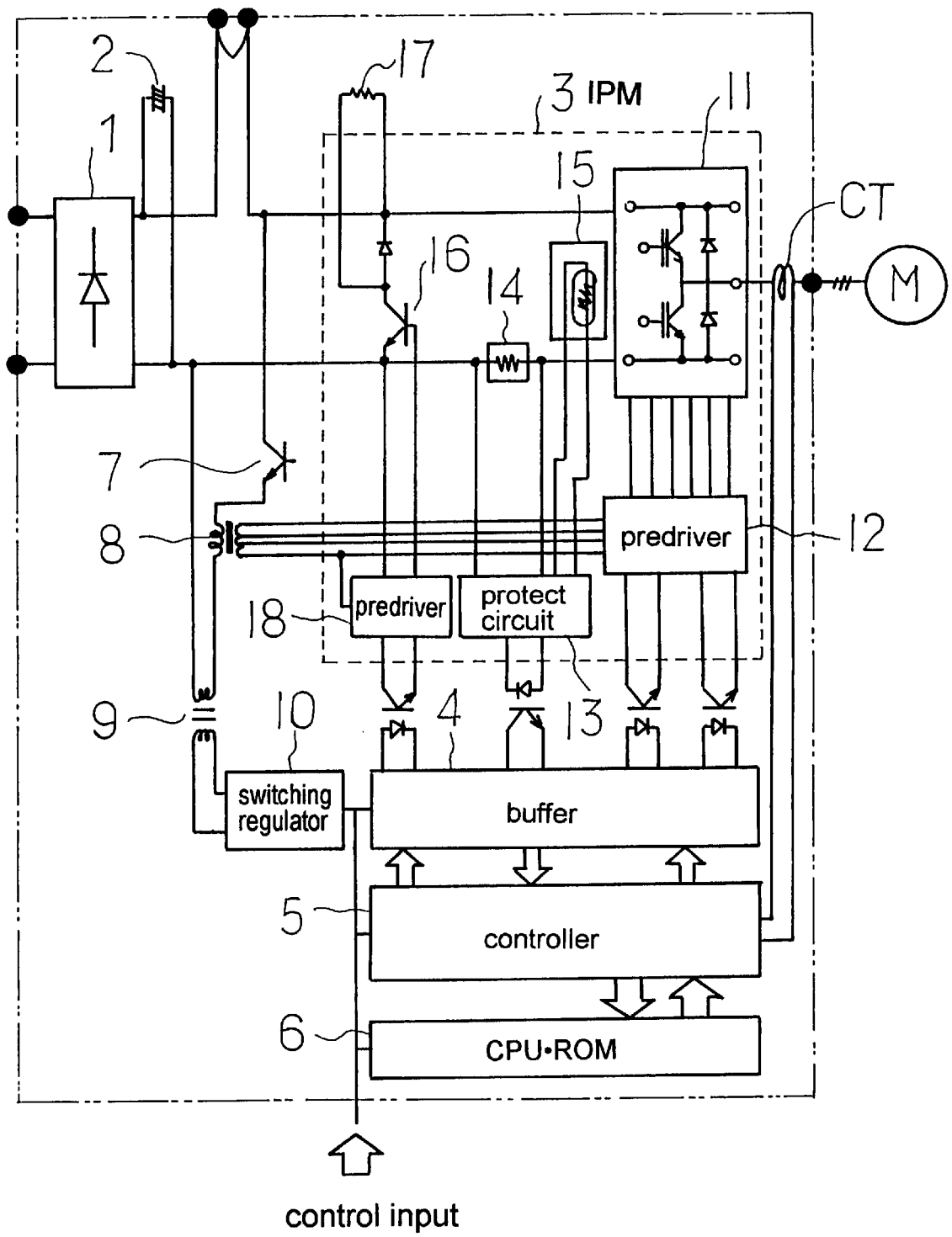
FIG. 10 is a block diagram showing a configuration of a circuit in a conventional inverter apparatus.
Figure 11:
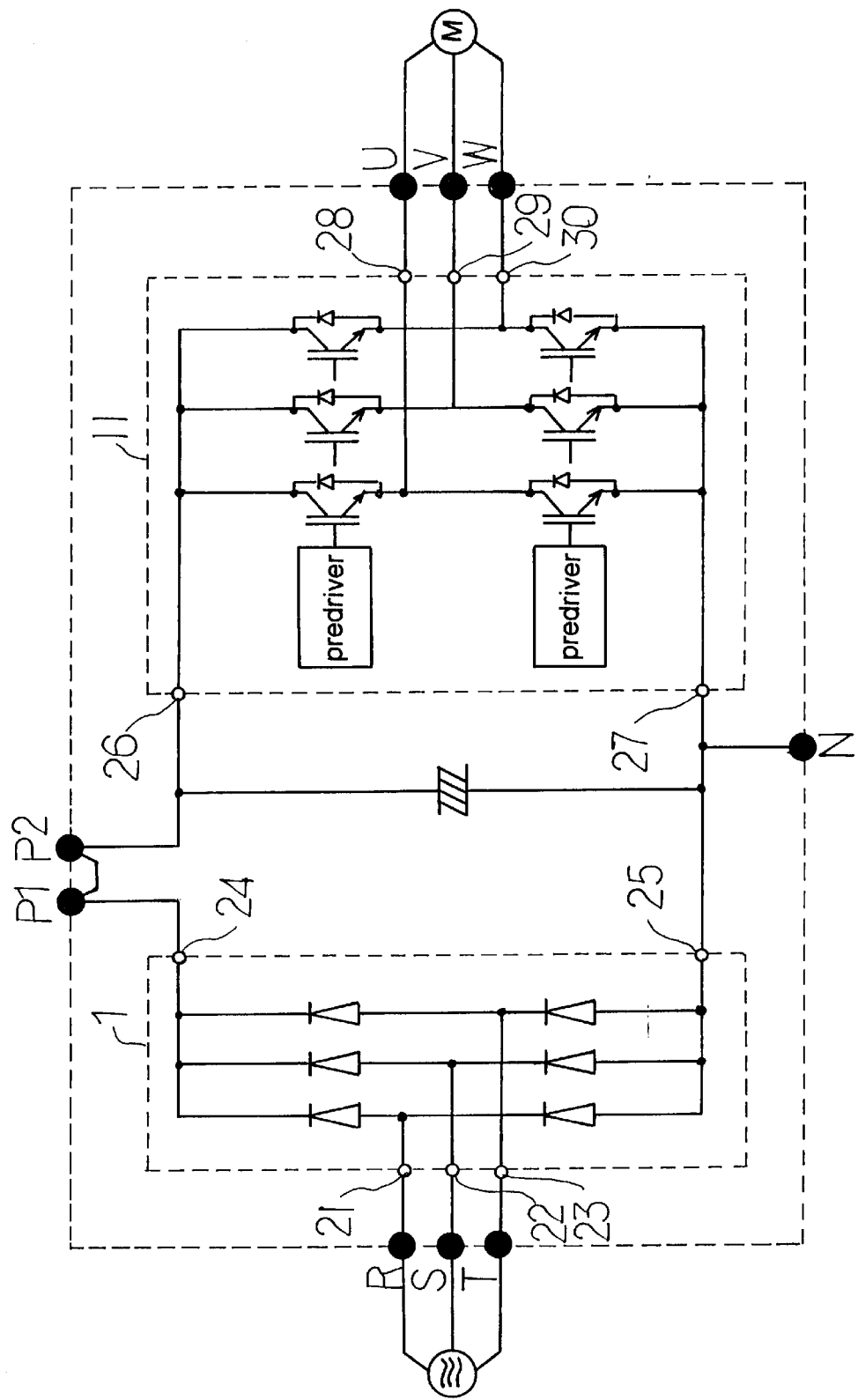
FIG. 11 is a block diagram showing a power conversion circuit in a conventional inverter apparatus.

FIG. 1 is a block diagram showing a configuration of a circuit in an inverter apparatus, including an IPM to which the present invention is applied. The inverter apparatus shown in FIG. 1 has almost the same configuration and effects as in the conventional inverter apparatus shown in FIG. 10. Thus, components used in the conventional inverter apparatus are assigned with the same reference numerals and their details are omitted. The differences between this inverter apparatus and the conventional inverter apparatus are two: first, a shunt resistor 31 is built into the IPM 3 in such a way as to be inserted in series with an output line from the IPM 3; and second, an insulating amplifier 32 or a voltage-resistant IC replacing the insulating amplifier is provided to return a terminal voltage of the shunt resistor 31 to the controller 5.

The shunt resistor 31 has two ends wired to control pins of the IPM 3 via a pattern. The shunt resistor 31 can provide an output current to the controller 5 as a voltage value to monitor an output current flowing through the motor M as in a current transformer. By building the shunt resistor 31 into the IPM 3, the current transformer can be omitted from the inverter to reduce the installation space, the number of wiring steps, and thus the size of the apparatus. In addition, the shunt resistor 31 can radiate heat efficiently.

Next, a configuration of the shunt resistor 31 for detecting an output current is described.

Figure 2:
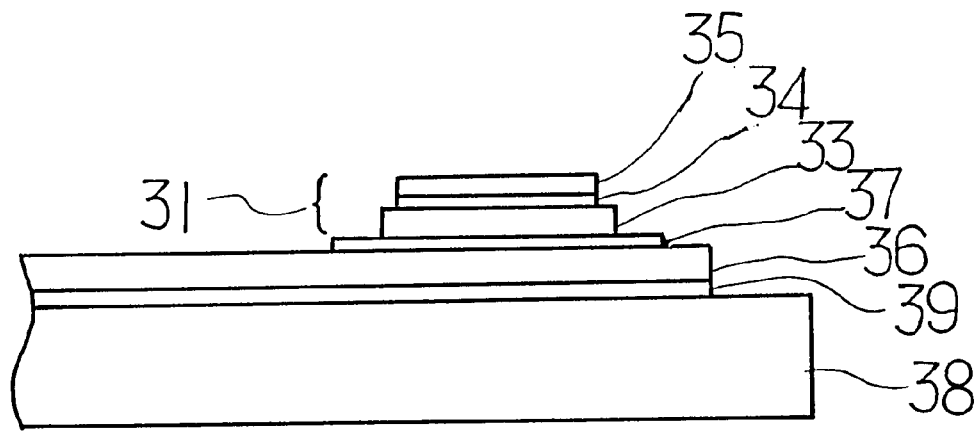
FIG. 2 shows an example of a configuration of the IPM near a shunt resistor.

FIG. 2 shows an example of a configuration of the IPM near the shunt resistor. The shunt resistor 31 is composed of an insulating layer 33, an adhesion layer 34, and a resistor 35. The shunt resistor 31 is mounted on an insulating substrate 36 together with functional elements constituting the IPM 3, that is, power elements of the inverter 11. The elements, such as the predrivers 12, 18 and a protection circuit, that do not require radiation are mounted on a printed circuit board separate from the insulating substrate 36. Although the insulating substrate 36 may comprise a metal insulating substrate, this embodiment uses a ceramic substrate having a copper circuit pattern on its surface, with the shunt resistor 31 joined with the substrate via a solder 37. The insulating substrate 36 is joined with a copper base 38 via a solder 39.

The shunt resistor 31 is soldered to the insulating substrate 36 of the IPM 3, and heat generated in the shunt resistor is radiated via the insulating substrate 36 and the copper base 38. The shunt resistor 31 built into the IPM 3 improves the radiating capability of the IPM 3 to enable it to be applied when high-current output of 50 A or more is required.

Next, another example of a configuration of a shunt resistor that can be applied to the IPM is explained.

Figure 3:
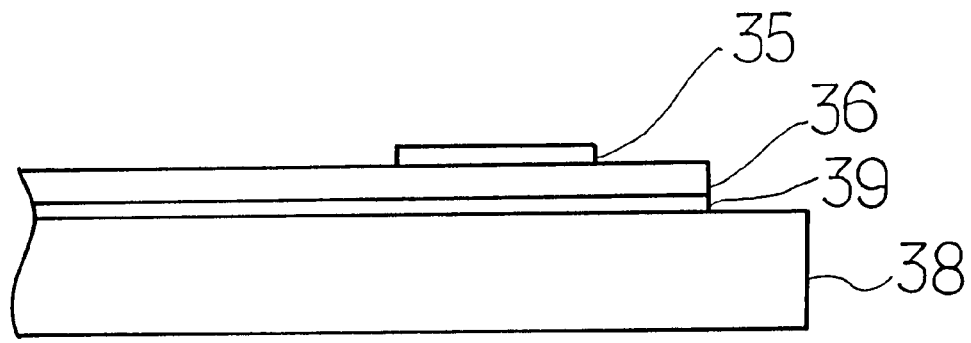
FIG. 3 shows another example of a configuration of the IPM near the shunt resistor.

FIG. 3 shows another example of a configuration of the IPM near the shunt resistor. According to this configuration, the shunt resistor 31 is formed by directly depositing the resistor 35 onto the insulating substrate 36 joined with the copper base 38 via the solder 39. In this manner, by directly forming the shunt resistor 31 on the insulating substrate 36, the heat resistance between the resistor 35 and the copper base 38 decreases to improve the IPM's radiating capability. This configuration can restrain temperature rise in the shunt resistor 31 and improve the inverter's load tolerance.

Although in this example, the resistor 35 is formed on the insulating substrate 36 by means of deposition, the resistor 35 may be joined with the insulating substrate 36 by means of pressure contact, adhesion, brazing or an active metal bonding.

Although the shunt resistor 31 has been mounted on the insulating substrate 36 as described above, the IPM 3 on which the shunt resistor 31 is mounted is manufactured to have different output currents depending on the specification of the inverter to which the IPM is applied. Thus, the resistance value of the shunt resistor 31 must be varied depending on the rated output current of the IPM 3. Consequently, a plurality of shunt resistors having different resistance values is provided so that a shunt resistor having an optimal resistance value is used as required. In this case, however, due to a large number of resistance values required, handling of the shunt resistors becomes quite cumbersome, as does stock management. Thus, the present invention uses only one shunt resistor 31, and adjusts the resistance value by varying the bonding positions of the wire. The details are described below.

Figure 4A:
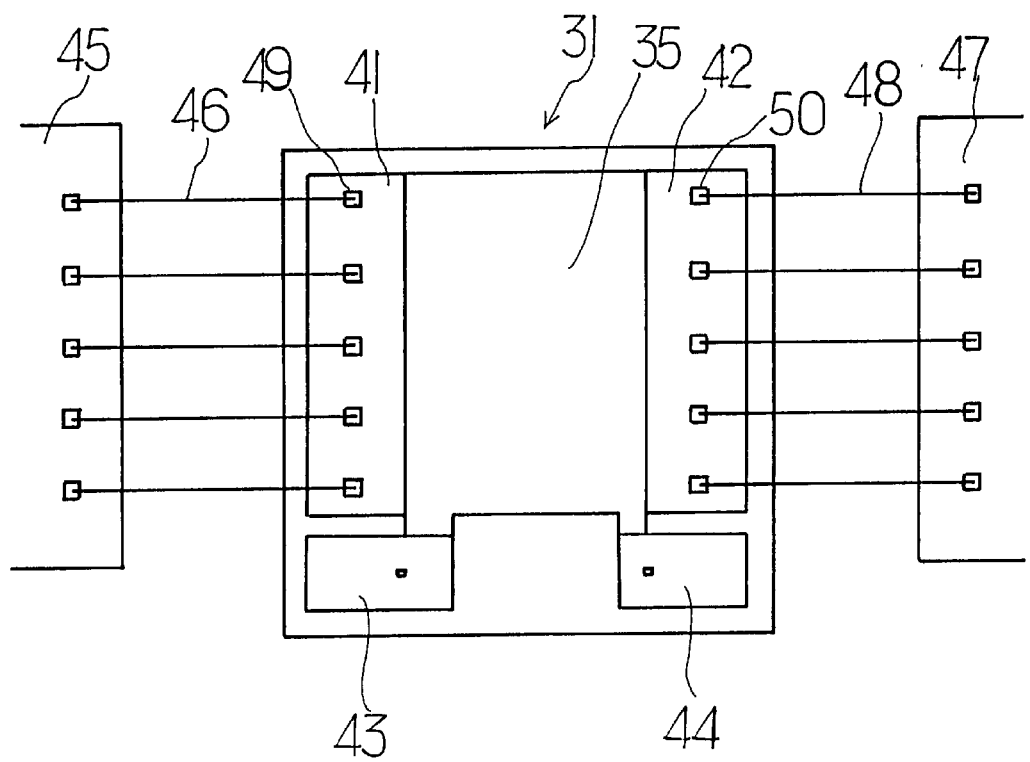
Figure 4B:
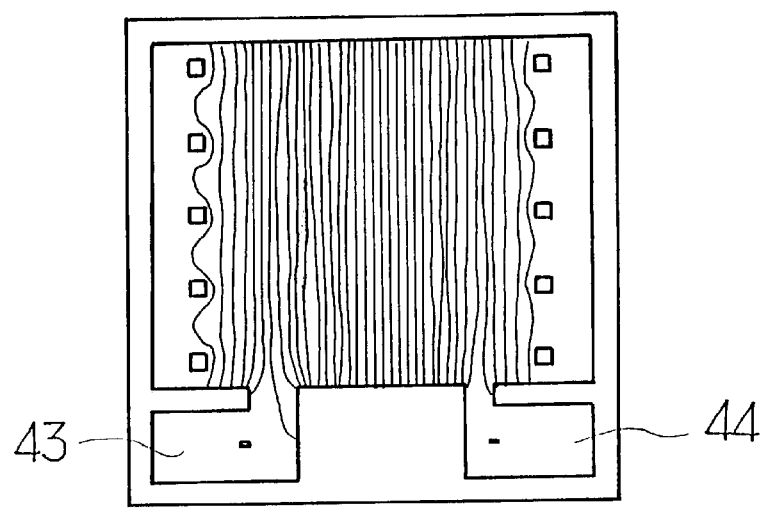

FIGS. 4(A) and 4(B) are plan views of the shunt resistor, wherein FIG. 4(A) shows that bonding positions are evenly arranged and FIG. 4(B) shows equipotential lines. The shunt resistor 31 is composed of the resistor 35, conductive bonding regions 41, 42 placed on the respective sides of the resistor 35, and conductive sense terminals 43, 44 connected to the respective sides of the resistor 35. The bonding region 41 is connected via bonding wires 46 to a circuit pattern 45 on the insulating substrate 36 that corresponds to a current output line of the inverter 11. The bonding region 42 is connected via bonding wires 48 to a circuit pattern 47 on the insulating substrate 36 that corresponds to a current output line leading to an output of the IPM 3. By way of an example, five bonding positions 49 are evenly arranged in the bonding region 41, while five bonding positions 50 are also evenly arranged in the bonding region 42. Although not shown, the sense terminals 43, 44 are connected to a circuit pattern on the insulating substrate 36 leading to control pins of the IPM 3, which are connected to the controller 5 via an external device, in this example, the insulating amplifier 32.

As described above, if the bonding wires 46, 48 are evenly bonded to the bonding regions 41, 42, the current density and the current path are also evenly distributed all over the resistor 35, and the equipotential lines in the resistor 35 are distributed in parallel as shown in FIG. 4(B).

By way of an example, when a 100 A current was allowed to flow through the shunt resistor 31, the voltage between the sense terminals 43 and 44 was 250 mV. This indicates that the resistance value of the resistor 35 is 2.5 mΩ as seen from between the sense terminals 43 and 44.

Figure 5A:
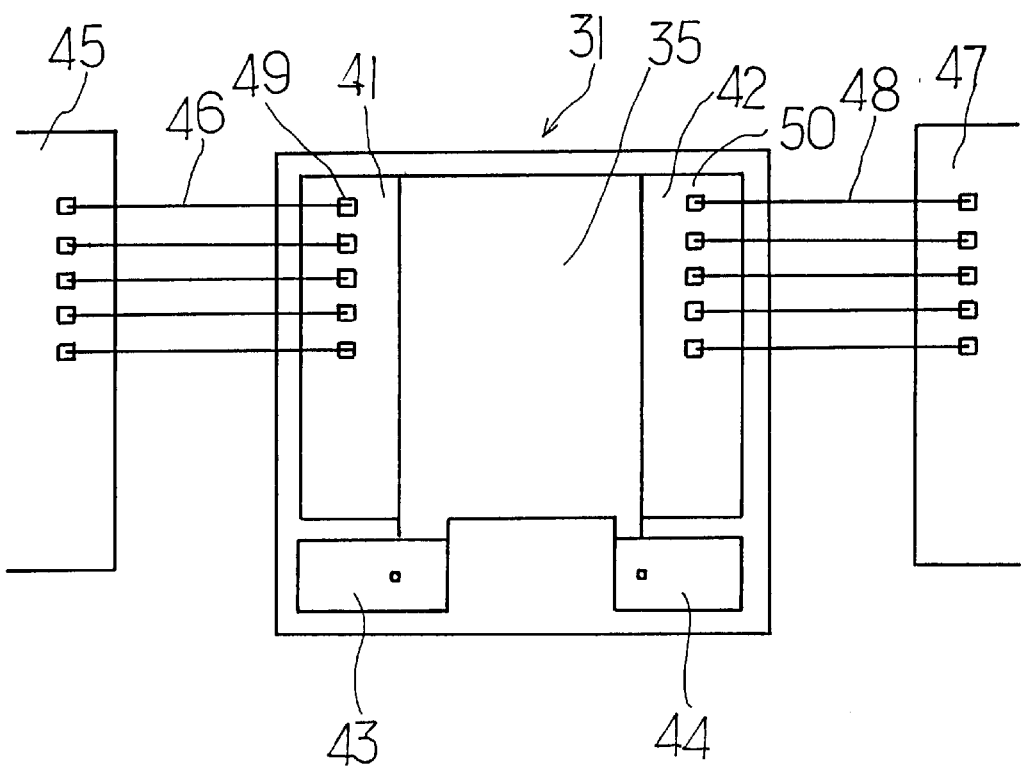
Figure 5B:
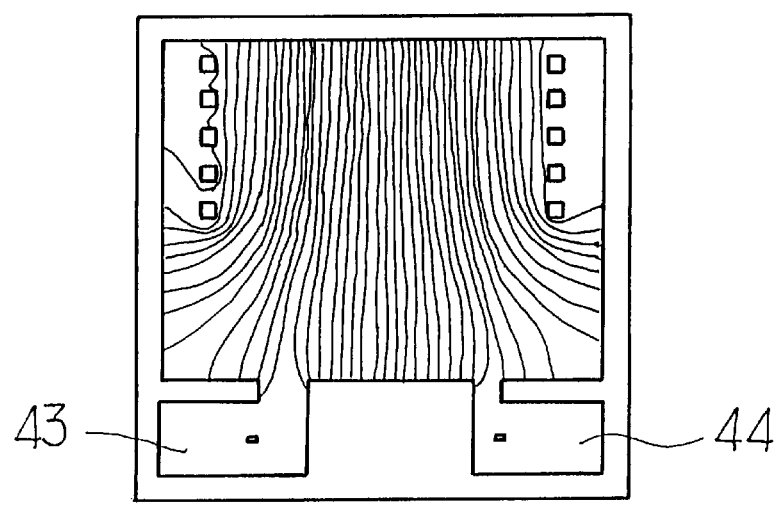

FIGS. 5(A) and 5(B) are plan views of the shunt resistor, wherein FIG. 5(A) shows that the bonding positions are biased to a side opposite to the sense terminals, and FIG. 5(B) shows the relevant equipotential lines. In this case, the bonding positions 49, 50 are closely arranged in the bonding regions 41, 42 away from 5 the sense terminals 43, 44. Also, in this case, the current density and the current path are concentrated between the bonding positions 49 and 50, and the current density decreases as the distance from these positions increases. Thus, the equipotential lines in the resistor 35 are distributed in parallel only between the bonding positions, and the intervals between the equipotential lines become larger on the side of the resistor closer to the sense terminals 43, 44, as shown in FIG. 5(B).

In this case, when a 100 A current was allowed to flow through the shunt resistor 31, the potential difference between the equipotential lines extending between the sense terminals 43, 44 was 181 mV. This indicates that the resistance value of the resistor 35 is 1.81 mΩ, as seen from between the sense terminals 43 and 44. This value is lower than that in the evenly-spaced bonding configuration.

Figure 6A:
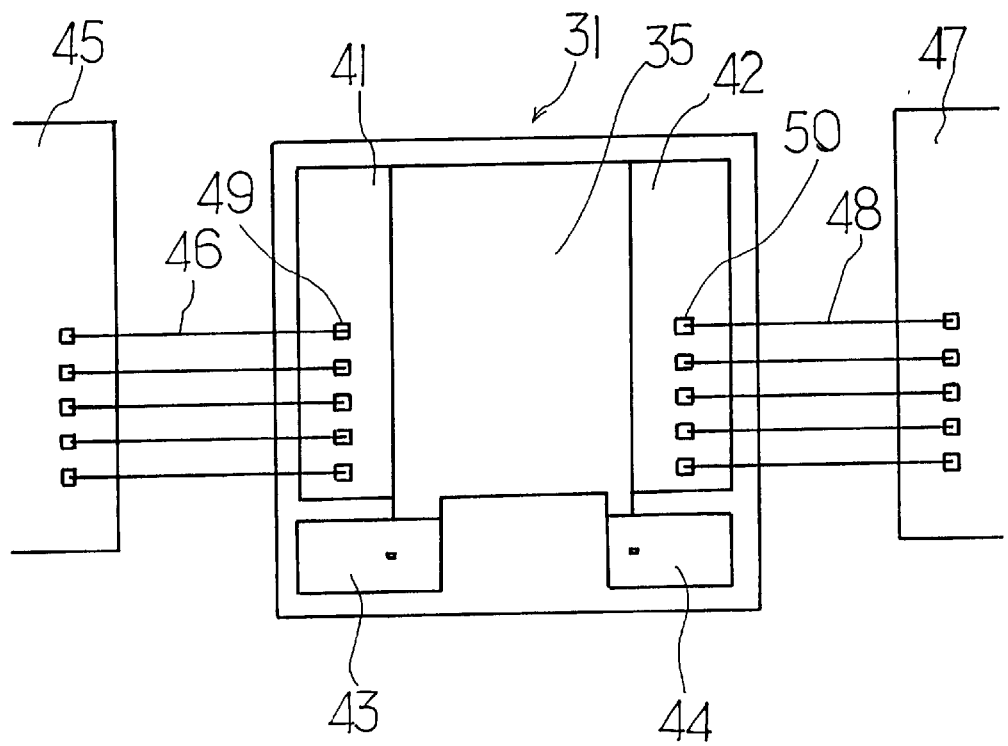
Figure 6B:
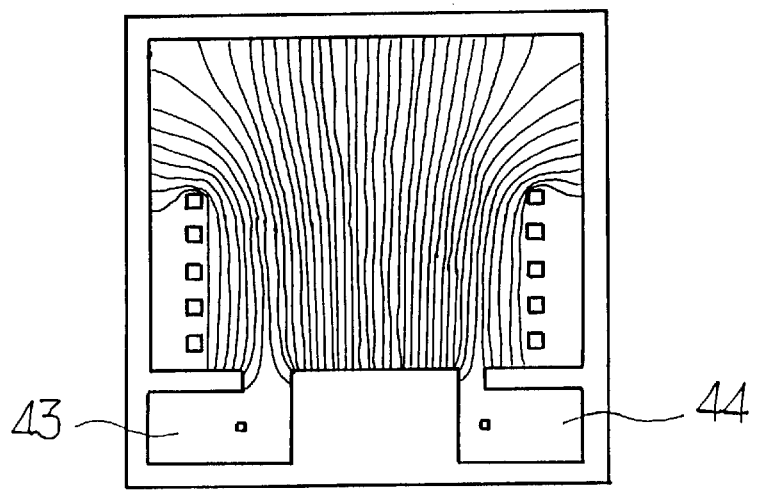

FIGS. 6(A) and 6(B) are plan views of the shunt resistor, wherein FIG. 6(A) shows that the bonding positions are biased to the sense terminals, and FIG. 6(B) shows the equipotential lines. When the bonding positions 49, 50 of the bonding wires 46, 48 are closely arranged in the bonding regions 41, 42 near the sense terminals 43, 44, the current density and the current path concentrate between the bonding positions 49 and 50, and the equipotential lines in the resistor 35 are distributed as shown in FIG. 6(B).

In this case, when a 100 A current was allowed to flow through the shunt resistor 31, the potential difference between the equipotential lines extending between the sense terminals 43, 44 was 290 mV. This indicates the resistance value of the resistor 35 is 2.9 mΩ, as seen from between the sense terminals 43 and 44, and tends to increase as the distance from the sense terminals 43, 44 decreases.

Using the characteristic that the resistance value of the shunt resistor 31 is varied by varying the positions of the wires as described above, one type of shunt resistor can be used to provide different resistance values, thereby eliminating the need to prepare a shunt resistor of a specific resistance value to meet the specification of the inverter.

In addition, in this inverter apparatus, the module terminals of the IPM 3 and the terminal blocks of the inverter apparatus are integrated together to enable the copper bars and their set screws to be omitted. This configuration is explained below.

Figure 7:
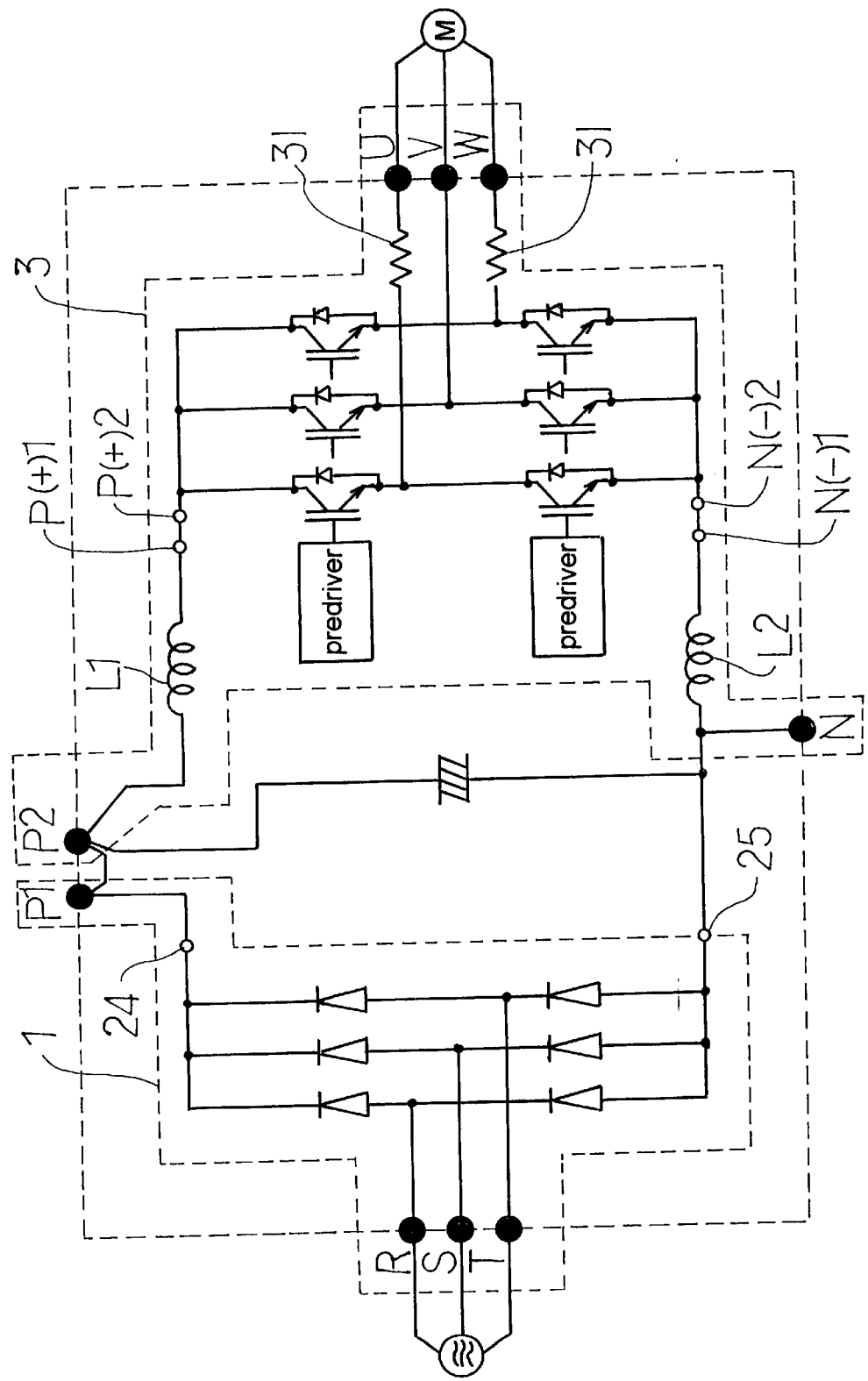
FIG. 7 is a block diagram showing a power conversion circuit in the inverter apparatus.

FIG. 7 is a block diagram showing a power conversion circuit in the inverter apparatus. The power conversion circuit is composed of the two modules, that is, the converter 1 and the IPM 3. The converter 1 comprises the module terminals as its I/O terminals, wherein the input terminals and positive-pole output terminals are integrated with the alternate-input terminal blocks R, S, T, P1 of the inverter apparatus, thereby eliminating the need for the copper bars and their set screws. The module terminals 24, 25 of the converter 1 are connected to an electrolytic capacitor.

Also in the IPM 3, the input-side module terminals are integrated with the direct-input terminal blocks P2, N of the inverter apparatus, and the output-side module terminals are integrated with the terminal blocks U, V, W. In addition, module terminals P(+)1, P(+)2, N(−)1, N(−)2 are provided near the IGBT constituting the inverter 11 of the IPM 3. These module terminals P(+)1, P(+)2, N(−)1, N(−)2 are connected to capacitors for a snubber circuit for restraining a surge voltage generated upon a switching operation of the IGBT.

In this manner, the input-side module terminals of the IPM 3 are integrated with the terminal blocks P2, N, so that the wires between the terminal blocks P2, N and the IGBTs tend to be long, thereby increasing the inductances L1, L2 of the internal wires between the terminal blocks P2, N and the IGBT. Especially, in an inverter apparatus of a medium or large capacity, inductances L1, L2 of the wires may cause a large surge voltage to be generated upon a switching operation of the IGBT, thus destroying the IGBT. Since, however, the module terminals P(+)1, P(+)2, N(−)1, N(−)2 for the snubber circuit are provided near the IGBT, the effects of the inductances L1, L2 between the terminal blocks P2, N and the IGBT can be eliminated.

Figure 8A:
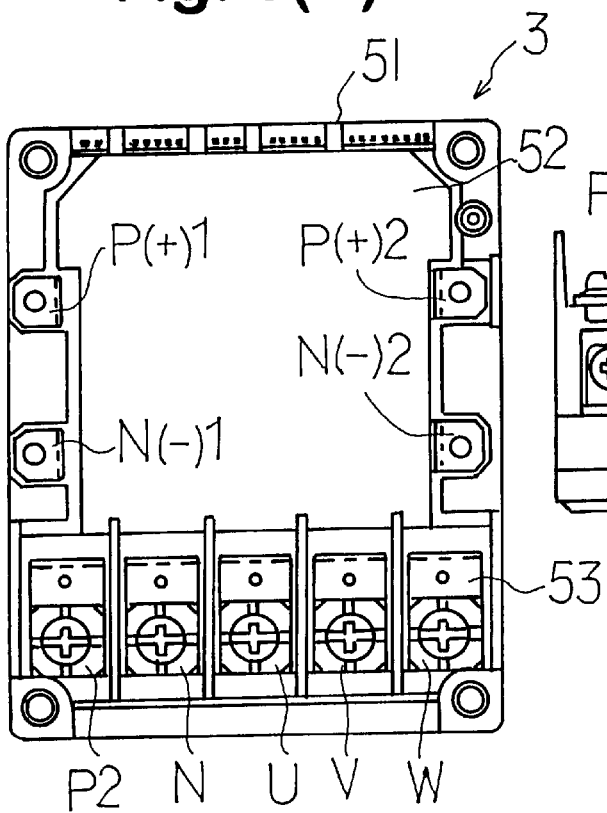
Figure 8B:
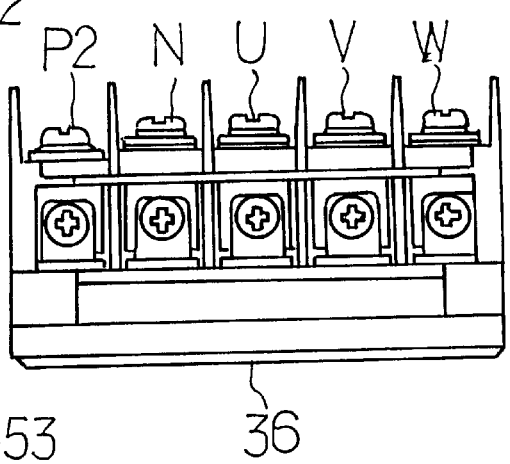
Figure 8C:
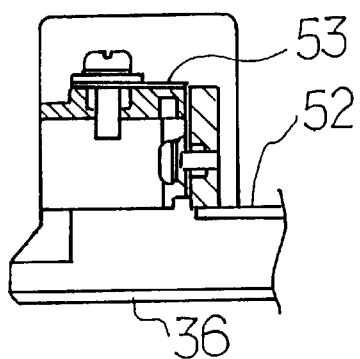
Figure 8D:
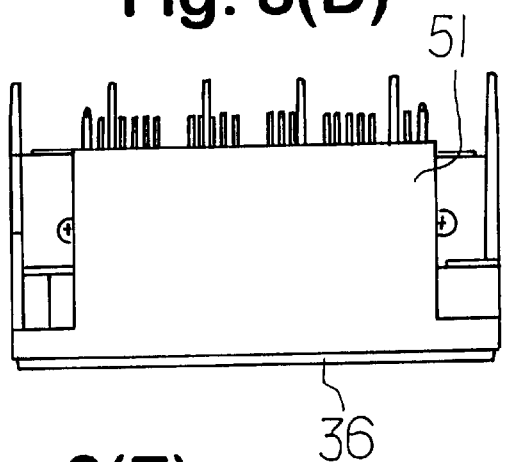
Figure 8E:
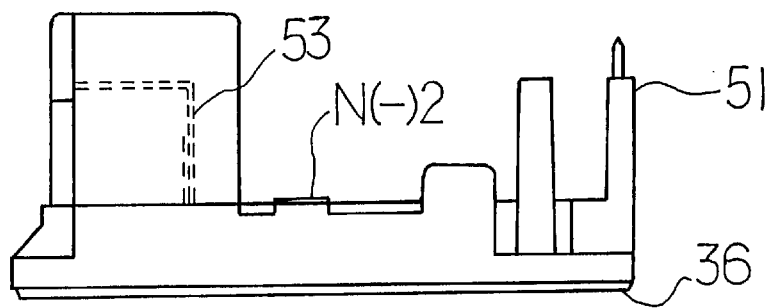

FIGS. 8(A)–8(E) show an example of the appearance of the IPM. FIG. 8(A) is a plan view, FIG. 8(B) is a front view, FIG. 8(C) is a partial sectional view of the terminal block, FIG. 8(D) is a rear view, and FIG. 8(E) is a right-side view. The IPM 3 comprises, on a frame mounted at an outer circumferential portion of the copper base 38, the inverter apparatus terminal blocks P2, N, U, V, W integrated with the module terminals of the IPM, the module terminals P(+)1, P(+)2, N(−)1, N(−)2 for the snubber circuit, and a connector 51 having control pins to be connected to an external control circuit. Two sets of the terminals blocks P2, N, U, V, W are provided, wherein one set is provided on the top surface of the frame, while the other set is provided on the front surface of the frame. The IGBT, predrivers 12, 18, protect circuit 13 and shunt resistor 31 formed on the insulating substrate 36 are located at the center of the frame and are sealed by a cover 52.

Two capacitors for the snubber circuit are placed on the cover 52 and directly connected to the module terminals P(+)1, N(−)1 and P(+)2, N(−)2, respectively. The terminal block P2 is connected to the terminal block P1 of the converter 1 and electrolytic capacitor, and the terminal blocks U, V, W are connected to the motor M.

In these module terminals of the IPM 3 and the terminal blocks of the inverter apparatus, the portions that can be shared are integrated together by using the internal wires 53. Consequently, the needs for copper bars and their mounting screws are eliminated, thus helping to substantially reduce both the number of assembly steps and the installation space required for the inverter apparatus.

In addition, the module terminals P(+)1, P(+)2, N(−)1, N(−)2 for the snubber circuit are separately provided and connected to the circuit pattern located near the IGBT. Consequently, even if the module terminals and the terminal blocks of the inverter apparatus are integrated together to increase the length of the internal wires 53 between the terminal blocks and the IGBT and thus the inductances of the internal wires 53, the snubber circuit operates immediately near the IGBT to directly restrain surge voltages generated upon switching. As a result, the presence of any inductance can be substantially neglected to reliably prevent the IGBT from being destroyed by a surge voltage.

FIGS. 9(A)–9(F) show another example of the appearance of the IPM. FIG. 9(A) is a plan view, FIG. 9(B) is a front view, FIG. 9(C) is a rear view, FIG. 9(D) is a partial sectional view of the terminal block, FIG. 9(E) is a bottom view near the terminal block, and FIG. 9(F) is a right side view. The IPM 3 comprises the inverter apparatus terminal blocks P2, N, U, V, W integrated with the module terminals of the IPM, the module terminals P(+)1, P(+)2, N(−)1, N(−)2 for the snubber circuit, and the connector 51 having control pins for connection to an external control circuit. Two sets of the terminals blocks P2, N, U, V, W are provided on the top side of the frame. The IGBT, predrivers 12, 18, protect circuit 13, and shunt resistor 31 formed on the insulating substrate 36 are located at the center of the frame and are sealed by the cover 52.

The module terminals P(+)1, N(−)1 and P(+)2, N(−)2 are directly connected to the two capacitors for the snubber circuit placed on the cover 52. The terminal block P2 is connected to the terminal block P1 of the converter 1 and electrolytic capacitor, and the terminal. blocks U, V, W are connected to the motor M.

In this IPM 3, the module terminals and the terminal blocks of the inverter apparatus are also integrated together via the internal wires 53 to eliminate the needs for copper bars and their mounting screws for wiring. In addition, since the module terminals P(+)1, P(+)2, N(−)1, N(−)2 for the snubber circuit are connected to the circuit pattern located immediately near the IGBT, the snubber circuit operates immediately near the IGBT to enable the effects of any inductance for wires between the terminal blocks of the inverter apparatus and the IGBT to be neglected.

As described above, the present invention is formed to incorporate a shunt resistor for detecting an output current, both ends of which can be connected to an external device. This configuration enables the inverter apparatus to omit the current transformer and thus to reduce requirements for both installation space and the number of wiring steps, and also to enable the output current to be controlled based on the detected voltage by using a connection with the external device.

In addition, the radiating capability of the apparatus can be improved by providing the shunt resistor on the insulating substrate with the power elements mounted thereon, so that the present invention can be applied to an inverter apparatus designed for high currents of 50 A and more.

In addition, by varying the bonding positions of the wires connected to the shunt resistor to vary the resistance value, a single shunt resistor can be used to form a plurality of resistance values.

Furthermore, by integrating the module terminals and the terminal blocks of the inverter apparatus together, internal wiring materials and set screws can be omitted to reduce requirements for both installation space and the number of assembly steps. In addition, since the terminals for the snubber circuits are drawn from a position immediately near the power elements, the present invention can eliminate the effects of any wire inductance associated with the longer wire lengths required for integration of the module terminals and the terminal blocks.

While the invention has been explained with reference to the specific embodiments; of the invention, the explanation is illustrative and the invention is limited only by the appended claims.

What is claimed is:

1. A power conversion component comprising:
a power semiconductor element having an output line,
a drive circuit connected to the power semiconductor element for driving the same,
a protect circuit connected to the power semiconductor element, said power conversion component element, drive circuit and protect circuit being integrated in a same package,
a shunt resistor provided in series with the output line from the power conversion component element to detect an output current and including two bonding areas spaced apart from each other and having a plurality of bonding locations, and two ends connected to the two bonding areas respectively, one bonding area being connected to the output line leading to the power conversion component element through the bonding locations and the other bonding area being connected to the output line leading to an output end through the bonding locations; and
control pins connected to the ends of the shunt resistor to be connected to an external device through a wiring pattern, said bonding locations in each bonding area being changed relative to each other and the control pin corresponding thereto to change a resistance of the shunt resistor.

2. A power conversion component according to claim 1, further comprising an insulating substrate on which said power conversion component element is mounted, said shunt resistor having a resistor with an insulating layer, said insulating layer being joined onto the insulating substrate to thereby improve a thermal dissipation of the component.

3. A power conversion element according to claim 1, further comprising an insulating substrate on which said power conversion component element is mounted, said shunt resistor being directly joined to the insulating substrate.

4. A power conversion element according to claim 3, wherein said resistor is joined with said insulating substrate by one of means including deposition, active metal bonding, pressure welding, adhesion and brazing.

5. A power conversion component according to claim 1, wherein said shunt resistor further includes a resistor portion between the two bonding areas, said bonding locations in each bonding area being equally spaced apart from each other.

6. A power conversion component according to claim 5, wherein said bonding locations in the respective bonding areas are changed close to or away from the control pins to change the resistance of the shunt resistor.

7. A power conversion component comprising:

a power conversion component element having a main circuit, internal wires, and module terminals connected to the main circuit, at least some of the module terminals having terminal blocks into which the power conversion component is integrated, a plurality of said terminal blocks being connected together through the internal wires to allow one line to have the plurality of the terminal blocks, a drive circuit connected to the power conversion component element for driving the same, and a protect circuit connected to the power conversion component element, said power conversion component element, drive circuit and protect circuit being integrated in a same package.

8. A power conversion element according to claim 7, further comprising an independent terminal drawn from a portion adjacent to the power conversion component element, to which an element for restraining a surge voltage caused by a switching operation of the power conversion component element is connected.

9. A power conversion element according to claim 8, further comprising a shunt resistor provided in series with an output line from the power conversion component element to detect an output current, end voltages of said shunt resistor being output to an external device.

10. A power conversion component according to claim 7, wherein two terminal blocks are situated adjacent to each other, one terminal block being oriented upwardly and the other terminal block being oriented sidewardly.

11. A power conversion component according to claim 7, wherein two terminal blocks are situated adjacent to each other and orienting in a same direction.

12. A process for manufacturing a power conversion element comprising a power conversion component element, a drive circuit for the power conversion component element, and a protect circuit for the power conversion component element, which are integrated into a same package, wherein a shunt resistor is provided in series with an output line from the power conversion component element to detect an output current, said shunt resistor including two bonding areas spaced apart from each other and having a plurality of bonding locations, and two ends connected to the two bonding areas respectively, one bonding area being connected to the output line leading to the power conversion component element through the bonding locations and the other bonding area being connected to the output line leading to an output end through the bonding locations, said bonding locations in each bonding area being changed to set a predetermined resistance value of said shunt resistor.

13. A process according to claim 12, wherein said shunt resistor further includes control pins connected to the ends of the shunt resistor to be connected to an external device through a wiring pattern.

\* \* \* \* \*

UNITED STATES PATENT AND TRADEMARK OFFICE
CERTIFICATE OF CORRECTION

PATENT NO. : 6,262,902 B1
DATED : July 17, 2001
INVENTOR(S) : Manabu Watanabe and Yoshinori Oda Page 1 of 1

It is certified that error appears in the above-identified patent and that said Letters Patent is hereby corrected as shown below:

Column 5,
Line 44, delete "5";

Column 8,
Lines 33, 37, 43, 55 and 61, change "conversion component" to -- semiconductor --, respectively;
Lines 59 and 64, change "element" to -- component --, respectively;

Column 9,
Lines 11, 19-20, 21-22, 27, 29-30 and 33, change "conversion component" to -- semiconductor --, respectively;
Lines 25 and 31, change "element" to -- component --, respectively;

Column 10,
Line 11, change "element" to -- component --, and change "conversion component" to -- semiconductor --;
Lines 12, 13-14, 16 and 22, change "conversion component" to -- semiconductor --, respectively.

Signed and Sealed this

Thirtieth Day of April, 2002

*Attest:*

JAMES E. ROGAN
*Attesting Officer*  *Director of the United States Patent and Trademark Office*